United States Patent
Van Den Brink et al.

(10) Patent No.: US 9,699,928 B2
(45) Date of Patent: Jul. 4, 2017

(54) PRINT MEDIA WITH INDUCTIVE SECONDARY

(71) Applicant: Access Business Group International LLC, Ada, MI (US)

(72) Inventors: Joseph C. Van Den Brink, Coopersville, MI (US); Sean T. Eurich, Holland, MI (US); Neil W. Kuyvenhoven, Ada, MI (US); Kaitlyn J. Turner, Kentwood, MI (US); Benjamin C. Moes, Wyoming, MI (US); Hai D. Nguyen, Grand Rapids, MI (US)

(73) Assignee: Access Business Group International LLC, Ada, MI (US)

( * ) Notice: Subject to any disclaimer, the term of this patent is extended or adjusted under 35 U.S.C. 154(b) by 201 days.

(21) Appl. No.: 14/370,516

(22) PCT Filed: Jan. 4, 2013

(86) PCT No.: PCT/US2013/020188
§ 371 (c)(1),
(2) Date: Jul. 3, 2014

(87) PCT Pub. No.: WO2013/103749
PCT Pub. Date: Jul. 11, 2013

(65) Prior Publication Data
US 2015/0022980 A1    Jan. 22, 2015

Related U.S. Application Data

(60) Provisional application No. 61/583,831, filed on Jan. 6, 2012.

(51) Int. Cl.
*H05K 1/00* (2006.01)
*H05K 7/02* (2006.01)
(Continued)

(52) U.S. Cl.
CPC ............ *H05K 7/02* (2013.01); *H05K 1/028* (2013.01); *H05K 1/092* (2013.01); *H05K 1/111* (2013.01);
(Continued)

(58) Field of Classification Search
USPC .................................................. 361/749, 748
See application file for complete search history.

(56) References Cited

U.S. PATENT DOCUMENTS 7,923,938 B2    4/2011  Sokola
2005/0264540 A1*  12/2005  Niwa ................... G06F 1/1616
                                                    345/173
(Continued)

FOREIGN PATENT DOCUMENTS

DE   197 21 057   11/1998
EP   2 211 295    7/2010
(Continued)

OTHER PUBLICATIONS

International Search Report and Written Opinion of the International Searching Authority for International Application No. PCT/US13120188 mailed Oct. 15, 2013.

*Primary Examiner* — Andargie M Aychillhum
(74) *Attorney, Agent, or Firm* — Warner Norcross & Judd LLP

(57) ABSTRACT

An item of print media (30) including an inductive secondary (50) for providing power to a load (32). The inductive secondary is responsive to an electromagnetic flux to generate a time-varying current or voltage therein. The current or voltage induced in the inductive secondary directly or indirectly powers the load to thereby enhance the functionality and/or the appeal of the item of print media without significantly adding to its cost. The load can provide a visual and/or auditory output, and can include an electroluminescent display, an e-ink display, a piezo speaker coil, an (Continued)

electrostatic speaker, an OLED, an LED or an LCD display. Embodiments of the invention can be utilized in connection with a wide variety of print media, including for example books, booklets, pamphlets, labels, magazines, manuals, brochures, maps, charts, posters, journals, newspapers or loose leaf pages.

6 Claims, 6 Drawing Sheets

(51) Int. Cl.
*H05K 1/02* (2006.01)
*H05K 1/09* (2006.01)
*H05K 1/11* (2006.01)
*H05K 1/16* (2006.01)
*H05K 13/00* (2006.01)
*H01F 27/28* (2006.01)
*H05K 3/36* (2006.01)
*H01F 38/14* (2006.01)

(52) U.S. Cl.
CPC ......... *H05K 1/165* (2013.01); *H05K 13/0023* (2013.01); *H01F 27/2804* (2013.01); *H01F 38/14* (2013.01); *H05K 3/361* (2013.01); *H05K 2201/032* (2013.01); *H05K 2201/0329* (2013.01); *H05K 2201/086* (2013.01); *H05K 2201/1003* (2013.01); *H05K 2201/1028* (2013.01); *H05K 2201/10037* (2013.01); *H05K 2201/10386* (2013.01); *H05K 2201/10401* (2013.01); *Y10T 29/49117* (2015.01)

(56) References Cited

U.S. PATENT DOCUMENTS

| | | | |
|---|---|---|---|
| 2007/0138923 A1 | 6/2007 | Sokola | |
| 2008/0236099 A1* | 10/2008 | Goel | B65D 5/4295 53/139.4 |
| 2009/0084593 A1 | 4/2009 | Suzuki et al. | |
| 2009/0173795 A1 | 7/2009 | Ochi et al. | |
| 2011/0062793 A1* | 3/2011 | Azancot | H01F 38/14 307/116 |

FOREIGN PATENT DOCUMENTS

| | | |
|---|---|---|
| WO | 2007/067854 | 6/2007 |
| WO | 2011/127334 | 10/2011 |

* cited by examiner

PRINT MEDIA WITH INDUCTIVE SECONDARY

BACKGROUND OF THE INVENTION

The present invention relates to print media including an inductive secondary for providing power to a load.

Print media is widely utilized to convey graphics and text in a still format. Books, magazines and newspapers, for example, lack moving pictures and sound, but remain attractive as low cost alternatives to so-called electronic media devices.

Methods have been developed to provide limited audio or video with traditional print media. In many such instances, a conventional battery provides power to internal electronics for powering a speaker, a light, or both. However, a battery can have a limited useful life, while potentially adding bulk and expense to the item of print media.

More recent methods include utilizing conductive ink traces on flexible substrates. However, conductive ink traces are in many instances limited in their ability to provide suitable amounts of power. In particular, silver ink traces may provide inadequate current and/or voltage, and can require expensive post manufacture processing such as the application of solder points.

SUMMARY OF THE INVENTION

The present invention provides an item of print media including an inductive secondary for providing power to a load. The inductive secondary is responsive to an electromagnetic flux to generate a time-varying current or voltage therein. The current or voltage induced in the inductive secondary is then utilized to directly or indirectly power a load having a visual and/or auditory output, thereby enhancing the functionality and/or the appeal of the item of print media without significantly adding to its cost.

Embodiments of the invention can be utilized in connection with a wide variety of print media, including for example books, booklets, pamphlets, magazines, manuals, brochures, maps, charts, posters, journals, newspapers or loose leaf pages. In these embodiments, the inductive secondary can be concealed or embedded with a cover, a binding, a page, a sleeve, a jacket or combinations of the same. In addition, the inductive secondary can include a wire coil or a PCB coil. In one embodiment, a PCB coil is embedded within the rear cover of a book or a magazine. In this embodiment, the PCB coil defines one or more turns while encompassing an area coextensive with the book or magazine back cover.

The inductive secondary can be coupled to the load(s) through a conductive epoxy, adhesive, tape or ink. For example, a book spine can include a conductive epoxy to electrically couple an inductive secondary contained within the back cover to one or more pages of the book. The pages can include an electrically conductive edge bearing against the conductive epoxy to facilitate power transfer from the inductive secondary to a given load. The epoxy can extend across the spine in spaced apart conductive zones with an optional non-conductive adhesive therebetween. Conducting pads can also be utilized, optionally including two pads extending transversely across the book spine to electrically couple an inductive secondary to one or more pages of the book.

A load can include an electroluminescent display, an e-ink display, a speaker coil, an electrostatic speaker such as a piezoelectric speaker, an OLED, an LED or an LCD display. The load or loads can be positioned on a display area on a front cover, a back cover, one or more internal pages, or combinations thereof. A rechargeable battery or a capacitor can be coupled to the inductive secondary to power the loads when the print media is not in proximity to an energized primary coil.

In another embodiment, a sensor is included to determine if a given page is open and viewable by a user. For example, a page can include a photo detector to provide an output indicative of the presence of ambient light. Power from the inductive secondary can then be applied to activate or deactivate one or more loads in a display area. The inductive secondary can optionally extend across opposing pages of a book or magazine, having a first portion embedded in a first page and a second portion embedded in a second page. When the opposing first and second pages are in an open configuration, the inductive secondary is adapted to receive wireless power from a nearby inductive primary. In the closed position, the coupling between a nearby inductive primary and the inductive secondary is reduced, which can effectively prevent the undesired transfer of power to the folded inductive secondary.

In another embodiment, a heating element is provided to release an aroma from an item of print media. The heating element can receive power from an inductive secondary or an energy storage element associated within the item of print media. The heating element can self-activate when a corresponding page is opened, or in response to a user prompt. The heating element can include a segment of wire embedded within the item of print media coated with an aroma-releasing deposit. The deposit can be made conductive in some embodiments, release the aroma from the item of print media in response to a suitable electrical current. The heating element can also include conductive paper composed of resistive fibers, for example chopped carbon fibers and/or cellulose fibers.

These and other advantages and features of the present invention will be more fully understood and appreciated in view of the description of the current embodiments and the drawings.

DESCRIPTION OF THE CURRENT EMBODIMENTS

The current embodiments relate to print media including one or more inductive secondaries for providing power to a load. As noted below, the current embodiments can provide visual and auditory enhancements for an improved interactive experience while also improving the desirability of the print media at the point of sale.

Figure 1:
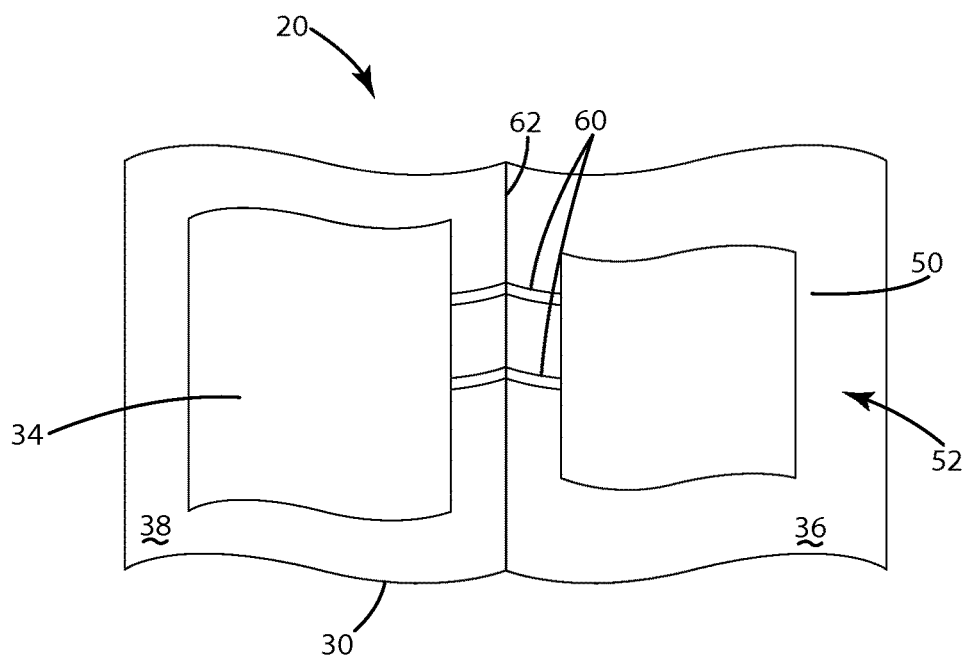
FIG. 1 is a plan view of print media including a wire coil.
Figure 2:
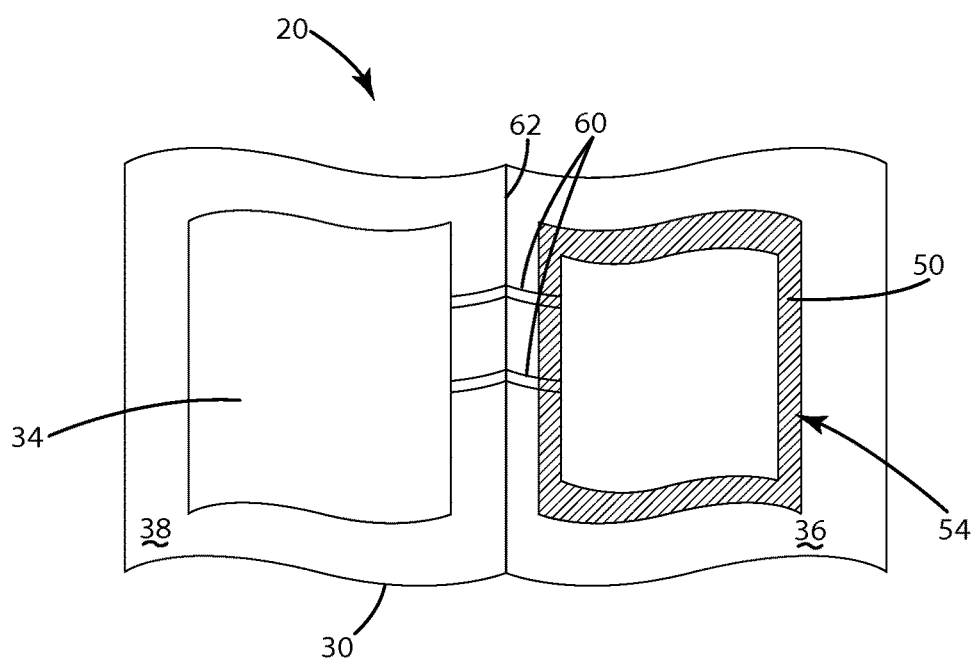
FIG. 2 is a plan view of print media including a flexible PCB coil.

Referring now to FIGS. 1-2, a system including print media 30 and an inductive secondary 50 in accordance with one embodiment is shown and generally designated 20. The print media 30 of FIGS. 1-2 includes a magazine, while in other embodiments the print media includes books, booklets, labels, packaging, pamphlets, manuals, brochures, maps, charts, posters, journals, newspapers, loose leaf pages, or other printed content whether on paper or some other substrate. The inductive secondary 50 is responsive to an electromagnetic flux to generate a time-varying current or voltage therein. The current or voltage induced in the inductive secondary 50 directly or indirectly powers one or more loads 32 within a display area 34 to thereby enhance the functionality and/or appeal of the print media 30 without significantly adding to its cost.

In the embodiments shown in FIGS. 1-2, the inductive secondary 50 includes a wire coil 52 or a PCB coil 54 (having one or more turns) encompassing an area generally coextensive with a page 36 of print media, while also being embedded within the respective page or cover 36. For example, a suitable wire coil 52 can include one or more turns of non-overlapping or single-layer wire having a low profile and being generally flexible. The wire coil 52 can optionally include thirty-six gage copper wire, while other gages and materials are also suitable. In addition, the wire coil 52 can include an insulating coating or jacket to electrically insulate the wire coil 52 from any adjacent pages. Other configurations involving low profile wire coils can also be utilized, including wire coils of various sizes, orientations, gages and turns. As alternatively shown in FIG. 2, the inductive secondary 50 can include the above-mentioned PCB coil 54 in place of the wound wire coil 52. A suitable PCB coil 54 can have one or more turns, encompassing a portion of the interior of the underlying page or cover 36. The PCB coil 54 can be formed according to known etched-circuit techniques used in the manufacture of printed circuit boards including the use of a flexible substrate, and can assume a variety of shapes and geometries, including a rectangular geometry as generally shown in FIG. 2. Optionally, the inductive secondary 50 includes an array of wire coils 52 and/or PCB coils 54, with multiple coils in a side-by-side and/or an overlapping relationship.

Figure 3:
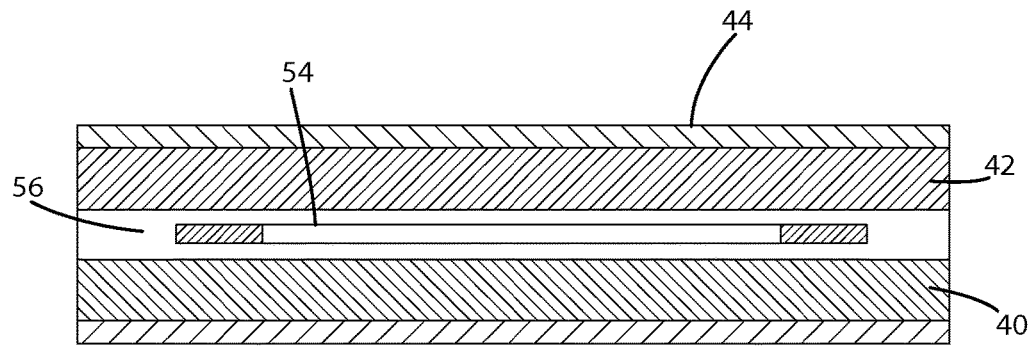
FIG. 3 is a cross-sectional view of a page of print media including an inductive secondary supported between layers of printed content.

As generally illustrated in FIG. 3, an optional dielectric material 56 encapsulates the wire wound coil 52 or the PCB coil 54 between adjacent sheets of printed content 40, 42. The dielectric material 56 can include an inflammable and/or insulating material such as Kapton® tape available from DuPont of Wilmington, Del., a dielectric ink, or a polymer laminate such as polypropylene or polyethylene. To achieve an improved quality factor, Q, the system 20 can include materials having a high magnetic permeability. For example, adjacent sheets 40, 42 can be embedded with high permeability materials such as iron, sendust or ferrite powders. Also by example, the adjacent sheets 40, 42 can receive a coating 44 having a high permeability material. Still by example, the adjacent sheets 40, 42 can be formed from flexible high permeability materials such as IRJ09 from TDK Corporation of Garden City, N.Y. A layer of ferromagnetic ink can also be used to achieve an improved quality factor.

Figure 4:
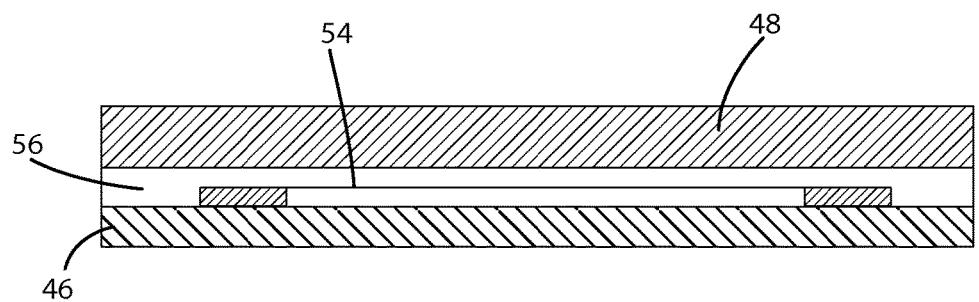
FIG. 4 is a cross-sectional view of a page of print media including an inductive secondary supported along a flexible substrate.

To improve the robustness of the electrical connection between the inductive secondary 50 and the display area 34, the inductive secondary 50 can be attached to a substrate 46 as generally illustrated in FIG. 4. For example, a flexible PCB coil 54 can have exposed areas of copper, or a wire coil 52 can have flattened leads at the terminals of the wire coil 52 to provide a larger flat area on which an electrical connection can be made. Once attached to the substrate 46, electronic circuitry can be printed directly on the substrate with conductive ink, with a connection being made at the exposed portions of the PCB coil 54 or the wire coil 52. To reduce the risk of a short circuit or other interaction between current in the inductive secondary 50 and the printed circuitry, a layer of shielding or a non-conductive isolation layer 56 can be utilized, leaving the exposed portions unshielded to allow for an electrical connection with printed circuitry. Once the proper connections are made, the entire assembly can be made more robust by applying a label, a transparent adhesive, or a lamination 48 across the assembly. The lamination or label 48 may already have the desired image for the page applied, or may include an alignment feature such as a pinhole(s) or optical imaging target. The lamination or label can also add protection in instances where higher voltages, currents or heating elements are utilized.

As noted above, the display area 34 can include one or more audio or visual devices 32 to enhance the print media 30. For example, a time-varying current or voltage induced in the inductive secondary 50 can be utilized to power a printed battery which in turn illuminates an electroluminescent display or an e-ink display. Also by example, an electroluminescent display or an e-ink display can be positioned on a front cover of the item of print media 30, for example a book, while the inductive secondary 50 is supported on a back cover. In this configuration, electromagnetic flux generated by a nearby inductive primary 22 at the point of sale can induce a time-varying current in the inductive secondary 50, which in turns powers the electroluminescent display or the e-ink display on the front cover. The audio or visual device 32 can also or alternatively include one or more low-profile piezo speaker coils, electrostatic speakers, OLEDs, LEDs or LCD displays for example.

Figure 5:
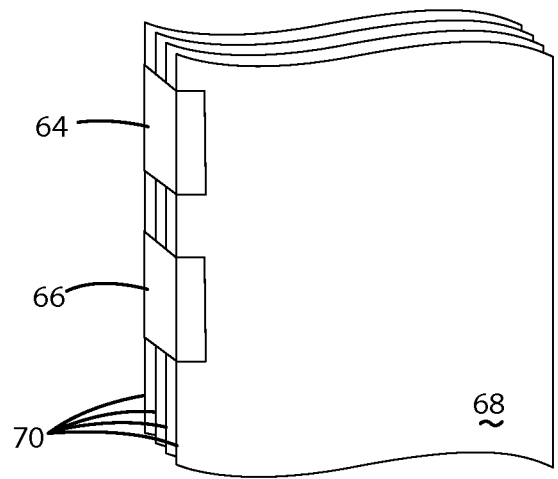
FIG. 5 is a perspective view of print media including conducting pads.

Referring again to FIGS. 1-2, each load 32 contained within the display area 34 is electrically coupled to the one or more inductive secondaries 50 through one or more conducting pads 60. As shown in FIGS. 1-2, two conducting pads 60 extend laterally across a vertical fold line or seam 62 and along portions of opposing pages or covers 36, 38. The conducting pads 60 can be formed of any electrically conductive material adapted to withstanding repeated folding or flexing of the print media 30 along its seam 62. For example, the conducting pads 60 can be formed of a conductive tape, an adhesive or an epoxy. Optional materials include copper tape with a conductive adhesive by the 3M Company of Maplewood, Minn., and braided metal fabric with a conductive adhesive. As optionally shown in FIG. 5, upper and lower conducting pads 64, 66 traverse the outer spine of the print media 30. Each page 68 can have a conductive edge 70 that becomes coupled to the conducting pads 64, 66 during the binding process. Each conductive edge 70 can have separated zones that provide both positive and negative connections to respective conductive pads 64, 66. Further optionally, each page 68 includes its own conducting pad adjacent the outer spine. Once the print media is opened, these pads are no longer in contact with spine conducting pads 64, 66. Power is not applied to pages that have been disconnected from the conducting pads 64, 66, and the resulting reduced load can indicate or indentify which page is opened, e.g., by detecting a change in the impedance of power or control signals. Further optionally, the conducting pads 64, 66 extend transversely across the spine of the print media 30 to interconnect a single inductive secondary 50 with multiple display areas 34 on respective pages of print media.

Figure 6:
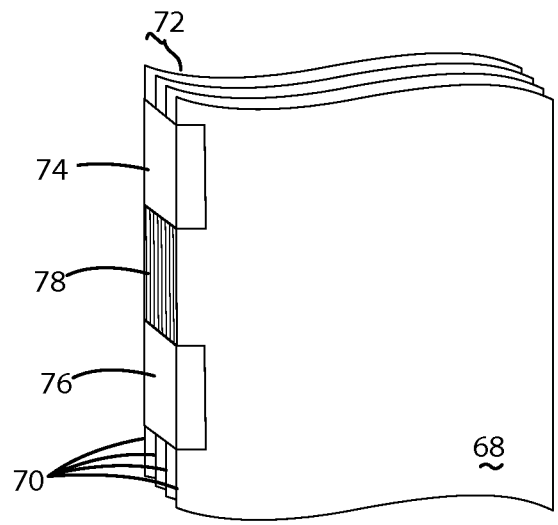
FIG. 6 is a perspective view of print media including a conductive binding.

As generally illustrated in FIG. 6, an electrically conductive epoxy can be used in place of, or in combination with, the upper and lower conducting pads 64, 66. In this configuration, the print media spine 72 includes first and second transverse zones 74, 76 of electrically conductive epoxy, while an optional non-conductive binder 78 extends in the region between the electrically conductive epoxy. The electrically conductive epoxy 74, 76 forms conductive paths for power and other control signals transversely across the spine 72. The print media 30 can also utilize metal staples or other metal bindings to provide an electrical connection. For example, each page 68 can include an eyelet formed of electrically conductive material to provide a connection to the staple or to the conductive binding without tearing or damaging individual pages. In order to protect conductive staples from contacting a user, the inner pages of a booklet can be stapled together to facilitate the transfer of power from the inductive secondary 50, while a cover is subsequently bound over these pages using one or more staples that are electrically isolated from the inductive secondary 50.

Figure 7:
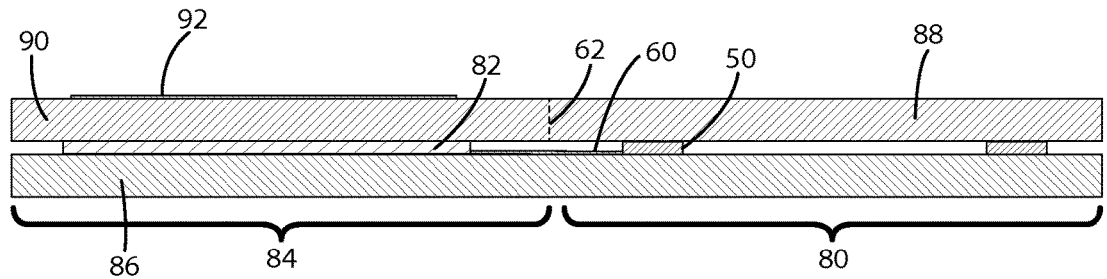
FIG. 7 is a cross-sectional view of a front and back cover of print media including an inductive secondary and an electroluminescent display.

In another embodiment as shown in FIG. 7, the inductive secondary 50 is embedded within a back cover 80 of an item of print media (e.g. a magazine) while an electroluminescent display 82 is embedded within a corresponding front cover 84. The inductive secondary 50 can include a high gage wire coil 52 or a PCB coil 54 supported on a substrate 86. The substrate 86 includes polyethylene in the present embodiment, but can include other materials as desired. The inductive secondary 50 is bonded to conducting strips 60 using a conductive epoxy, and a second sheet of polyethylene 88 (or other material) is placed over the exposed surface of the inductive secondary 50, forming the magazine back cover 80. Optional printed material can be deposited on the second sheet of polyethylene 88 before or after its application to the inductive secondary 50. The conducting strips 60 are then coupled to the electroluminescent display 82, which is oriented to provide lighting effects (e.g. background lighting) viewable through portions of the magazine front cover 84. For example, a page of text may be backlit for a user attempting to read the page in low lighting conditions. A laminate 90 is then applied over the electroluminescent display 82. Text or graphics 92 are then applied over the outward facing surface of the laminate 90 using screen printing or roll-to-roll printing techniques. In use, the magazine front cover 84 can generate a visual output at the point of sale when the back cover 80 is proximate an inductive primary 22 contained within a magazine rack. Additional loads can also be powered by the inductive secondary 50, including a battery, a capacitor or a printed speaker circuit as discussed more fully below.

Figure 8:
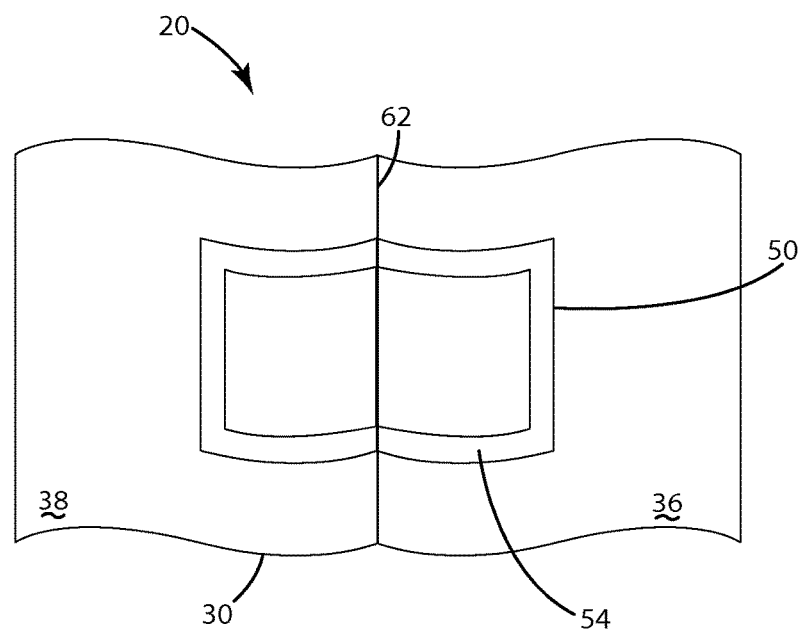
FIG. 8 is a plan view of print media including an inductive secondary extending on opposing pages.
Figure 9:
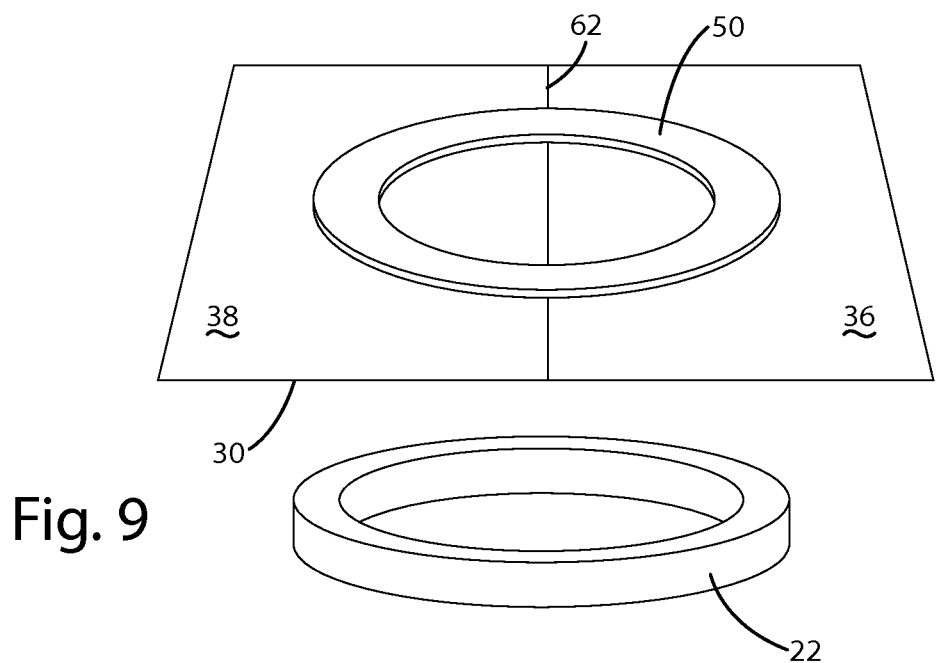
FIG. 9 is a perspective view of print media including an inductive secondary extending on opposing pages and opposite an inductive primary.
Figure 10:
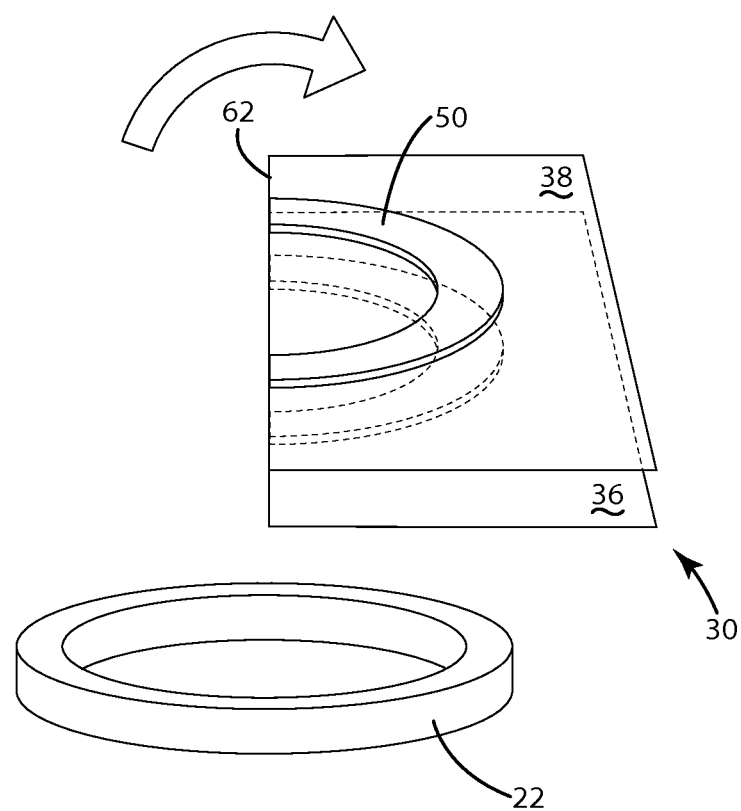
FIG. 10 is a perspective view of the print media of FIG. 9 folded in the closed position.

As optionally shown in FIG. 8-10, the inductive secondary 50 can extend across one or more fold lines or seams 62 in an item of print media 30. For example, the inductive secondary 50 can include a PCB coil 54 having first portion supported at a first page 36 and a second portion supported at a second page 38. In the open configuration as shown in FIG. 8, the PCB coil 54 is adapted to receive wireless power from a nearby inductive primary 22. For example, the inductive primary 22 can be embedded within a bookshelf, newsstand, magazine rack, countertop, portable charging pad, desktop or other surface for providing a source of wireless power to the PCB coil 54. The inductive primary 22 can form part of a contactless power supply including a driver 24 to drive the inductive primary 24 with a time-varying current or voltage, optionally under the control of a controller. When the item of print media 30 is closed along the fold line or seam 62, the coupling between the inductive primary 22 and the PCB coil 54 is reduced, which can effectively terminate the receipt of wireless power by the PCB coil 54. Advantageously, PCB coils associated with closed pages are not receiving wireless power, while substantially only the open facing PCB coil is receiving power from the nearby inductive primary 22. In this regard, an item of print media 30 can include multiple embedded inductive secondaries (corresponding to multiple pairs of odd and even pages), with only the inductive secondary spanning the open facing pages receiving wireless power. That is, the secondary spanning pages 1 and 2 receives power when those pages are open, but not the secondary spanning pages 3 and 4 or 5 and 6. As page 2 is turned and layered against page 1, the secondary spanning pages 3 and 4 receives power, but not the secondary spanning pages 1 and 2 or the secondary spanning pages 5 and 6.

The contactless power supply described above may include essentially any circuitry capable of supplying an AC signal to the primary coil 22. It may be desirable to use an inductive power supply including the resonant seeking circuit of the inductive power supply system disclosed in U.S. Pat. No. 6,825,620, which is entitled "Inductively Coupled Ballast Circuit" and issued Nov. 30, 2004, to Kuennen et al; the adaptive inductive power supply of U.S. Pat. No. 7,212,414, which is entitled "Adaptive Inductive Power Supply" and issued May 1, 2007, to Baarman; the inductive power supply with communication of U.S. Pat. No. 7,522,878 which is entitled "Adaptive Inductive Power Supply with Communication" and issued Apr. 21, 2009 to Baarman; the inductive power supply for wirelessly charging a LI-ION battery of U.S. Ser. No. 11/855,710, which is entitled "System and Method for Charging a Battery" and filed on Sep. 14, 2007 by Baarman; the inductive power supply with device identification of U.S. Ser. No. 11/965,085, which is entitled "Inductive Power Supply with Device Identification" and filed on Dec. 27, 2007 by Baarman et al; or the inductive power supply with duty cycle control of U.S. application Ser. No. 12/349,840, which is entitled "Inductive Power Supply with Duty Cycle Control" and filed on Jan. 7, 2009 by Baarman—all of which are incorporated herein by reference in their entirety.

Figure 11:
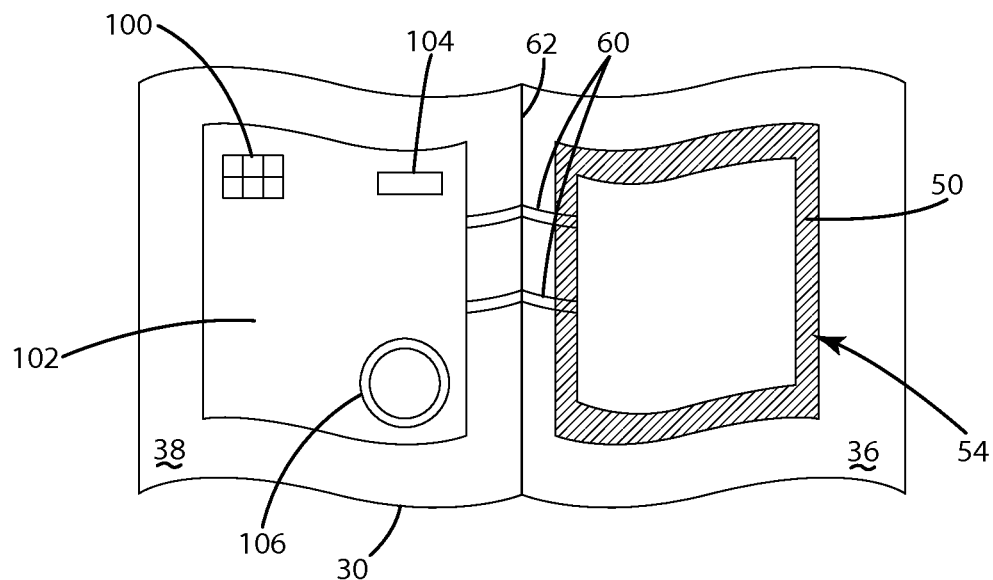
FIG. 11 is a plan view of print media including a printed circuit, a solar sensor, a printed battery, and a speaker coil.
Figure 12:
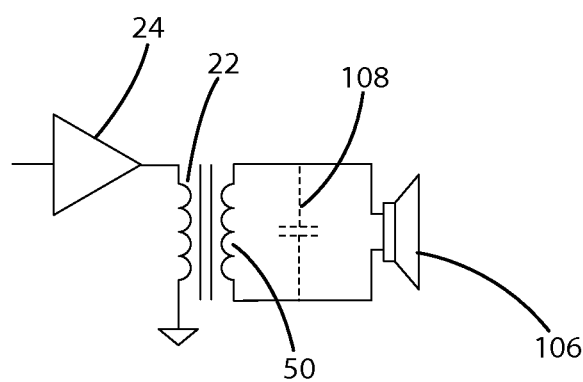
FIG. 12 is a circuit diagram of a contactless power supply and a secondary circuit.

As further optionally shown in FIG. 11, the print media 30 can include a sensor 100 adapted to determine whether a page is open and viewable by a user. For example, the sensor 100 can include an upward-facing photo detector on a page of printed content coupled to an embedded circuit 102. The photo detector 100 provides an output indicative of the presence or absence of ambient light, the presence of which can indicate that the instant page 38 (and its opposing page 36) is open and viewable by a reader. Alternatively, the sensor 100 can include a tab connected to the opposing page 36 when the instant page 38 is opened. The opening of the instant page 38 creates a slight tension in the tab, and by utilizing a piezoelectric or other mechanical sensor, the embedded printed circuit 102 can determine the instant page 38 has been opened. As also shown in FIG. 11, the embedded circuit 102 can include electrical components printed directly to the print media, or can other electrical components such as integrated circuits manufactured on a separate wafer and embedded within the print media. The embedded circuit 102 can also include an energy storage device 104. The energy storage device 104, for example a printed battery or a printed capacitor, is electrically connected between the inductive secondary 50 and a load 32. An optional rectifier converts a time-varying current or voltage in the inductive secondary 50 to a DC waveform for charging the energy storage device 104. The energy storage device 104 can power the load 32 when the print media 30 is not positioned near an energized primary coil 22. In the illustrated embodiment, the load 32 includes a printed piezoelectric speaker 106 to provide additional user feedback. The speaker 106 can be powered and controlled from the printed circuit 102, or the speaker 106 can be powered and controlled by the inductive primary 22. For example, the inductive primary 22 can generate a signal that is received and applied directly to the speaker 106, or the inductive primary 22 can utilize an amplitude or frequency modulated waveform so that a higher frequency carrier can be used. A higher frequency carrier can be advantageous because a resonant circuit utilizing a resonant capacitor 108 (shown in FIG. 12) can provide more efficient power and signal transfer to the inductive secondary 50.

In another embodiment, the load 32 includes a heating element. The heating element can be adapted to release an aroma or a scent when the corresponding page is opened by the user. This heating element may be powered from the energy storage element 104 within the print media 30, or can be powered from the inductive secondary 50 when the print media is placed proximate a wireless power transmitter, or both. The heating element can be activated when the corresponding page is opened, or when a user prompts the circuit to begin heating. This user prompt may be in the form of a capacitive, resistive, or pressure sensor that the user mechanically pushes, pulls, or presses. The heating element may include a segment of wire embedded within the magazine, a printed resistive conductor, or a portion of fabric or paper embedded with resistive materials that are heated as current passes through them. The material that releases the aroma can be deposited either directly on the heating element or very close to the element with an optional insulator therebetween. The material that releases the aroma may also be made conductive, wherein current passes from one conductive pad through the material into another conductive pad, directly heating the material itself. Once the material is used up, the path for current is lost and current no longer flows, potentially preventing an unnecessary loss of power.

To reiterate, print media with low-cost inductive secondaries can provide enhancements at the point of sale and an improved interactive experience to the user. The inductive secondary is operable to receive wireless power from near- and far-field contactless power supplies for transfer to one or more loads as desired. Wire coils and PCB coils are particularly well suited to provide sufficient power to loads requiring in excess of 100 mW, including, for example, electroluminescent displays, e-ink displays, piezo speaker coils, electrostatic speakers, OLEDs, LEDs or LCD displays. Embodiments of the invention can be utilized in connection with a wide variety of print media, including for example books, booklets, labels, pamphlets, manuals, brochures, maps, charts, posters, journals, newspapers or loose leaf pages. In these embodiments, the inductive secondary can be concealed or embedded with an exterior or interior surface, such as a cover, a binding, a page, a sleeve or a jacket.

The above descriptions are those of the current embodiments of the invention. Various alterations and changes can be made without departing from the spirit and broader aspects of the invention. For example, the current embodiments are described in relation to portable heating devices, but are also applicable to portable electronic devices not utilized in heating applications. Any reference to elements in the singular, for example, using the articles "a," "an," "the," or "said," is not to be construed as limiting the element to the singular.

The invention claimed is:

1. An item of print media comprising:
   a first substrate including textual or graphic content thereon; and
   an inductive secondary supported by the first substrate, wherein the inductive secondary is operable to drive a visual, olfactory, or auditory device in response to a time-varying electromagnetic field to enhance the textual or graphic content.

2. The item of print media of claim 1, wherein the inductive secondary includes one of a wire coil and a PCB coil.

3. The item of print media of claim 1, wherein the first substrate includes one of a page, a label, a cover, a jacket, a binding, a spine and a sleeve.

4. The item of print media of claim 1 further including a second substrate including a display area and supporting the visual or auditory device thereon.

5. The item of print media of claim 4 wherein the first and second substrates are joined along a fold line.

6. The item of print media of claim 1 wherein the visual or auditory device includes at least one of an electroluminescent display, an e-ink display, a piezo speaker coil, an electrostatic speaker, an OLED, an LED and an LCD display.

* * * * *